(12) United States Patent
McColloch

(10) Patent No.: US 7,597,590 B2
(45) Date of Patent: Oct. 6, 2009

(54) ELECTROMAGNETIC INTERFERENCE (EMI) COLLAR AND METHOD FOR USE WITH A PLUGGABLE OPTICAL TRANSCEIVER MODULE

(75) Inventor: Laurence R. McColloch, Santa Clara, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/205,328

(22) Filed: Sep. 5, 2008

(65) Prior Publication Data

US 2009/0196008 A1    Aug. 6, 2009

Related U.S. Application Data

(63) Continuation-in-part of application No. 12/027,027, filed on Feb. 6, 2008.

(51) Int. Cl.
*H01R 13/648* (2006.01)
(52) U.S. Cl. .............................. 439/607.18; 439/607.2; 29/874
(58) Field of Classification Search ............ 439/607.17, 439/607.18, 607.19, 607.2, 607.21; 29/874
See application file for complete search history.

(56) References Cited

U.S. PATENT DOCUMENTS

| 5,766,041 | A | 6/1998 | Morin et al. |
| 6,366,380 | B1 | 4/2002 | Chesavage |
| 6,817,782 | B2 | 11/2004 | Togami et al. |
| 7,195,404 | B1 | 3/2007 | Dudley |
| 7,351,090 | B1 * | 4/2008 | Moore ........................ 439/372 |
| 2007/0237489 | A1 * | 10/2007 | Sasser et al. ................ 385/147 |
| 2008/0207039 | A1 * | 8/2008 | Moore et al. ................ 439/346 |

* cited by examiner

*Primary Examiner*—Ross N Gushi (57) ABSTRACT

An EMI collar is provided that is configured to be secured about a housing of a pluggable optical transceiver module. The configuration of the EMI collar and the method by which the collar is attached to the housing of the transceiver module ensures that the collar will not be damaged when the transceiver module housing is inserted into a cage. Ensuring that the collar will not be damaged during insertion ensures that electrically conductive contact points on the collar will not be eliminated by insertion of the housing into a cage. In addition, dimples, or indentations, formed on the spring fingers of the EMI collar result in additional electrically conductive contact points on the fingers that result in a reduction in the size of the maximum EMI aperture dimension of the collar. Reducing the maximum EMI aperture dimension of the collar greatly improves the ability of the collar to attenuate EMI signals, even EMI signals having high frequencies.

18 Claims, 6 Drawing Sheets

ELECTROMAGNETIC INTERFERENCE (EMI) COLLAR AND METHOD FOR USE WITH A PLUGGABLE OPTICAL TRANSCEIVER MODULE

CROSS-REFERENCE TO RELATED APPLICATIONS

This application is a continuation-in-part (CIP) application and claims the benefit of the filing date of currently pending U.S. application Ser. No. 12/027,027, filed on Feb. 6, 2008, entitled "AN ELECTROMAGNETIC INTERFERENCE (EMI) SYSTEM AND METHOD FOR USE WITH AN OPTICAL TRANSCEIVER MODULE", which is incorporated by reference herein in its entirety.

TECHNICAL FIELD OF THE INVENTION

The invention relates to pluggable optical transceiver modules. More particularly, the invention relates to an electromagnetic interference (EMI) collar that attaches to a pluggable optical transceiver module and provides improved EMI shielding effectiveness.

BACKGROUND OF THE INVENTION

In optical communications networks, optical transceiver modules are used to transmit and receive optical signals over optical fibers. On the transmit side of a transceiver module, a light source (e.g., a laser diode) generates amplitude modulated optical signals that represent data, which are received by an optics system of the transceiver module and focused by the optics system into an end of a transmit optical fiber. The signals are then transmitted over the transmit fiber to a receiver node of the network. On the receive side of the transceiver module, the optics system of the transceiver module receives optical signals output from an end of a receive optical fiber and focuses the optical signals onto an optical detector (e.g., a photodiode), which converts the optical signals into electrical signals. The electrical signals are then processed to recover the data contained in the electrical signals.

The transmit and receive fiber cables have connectors on their ends (e.g., LC connectors), that are adapted to mate with transmit and receive receptacles, respectively, formed in the transceiver module. A variety of optical transceiver module configurations are used in optical communications network. Some optical transceiver modules have multiple laser diodes on the transmit side and multiple photodiodes on the receive side for simultaneously transmitting multiple optical signals and receiving multiple optical signals, respectively. In these types of transceiver modules, the transmit fiber cables and the receive fiber cables have multiple transmit and multiple receive optical fibers, respectively. The transmit and receive fiber cables are typically ribbon cables having ends that are terminated in a connector module that is adapted to be plugged into a receptacle of the transceiver module.

Some optical transceiver modules have a single laser diode on the transmit side and a single photodiode on the receive side for simultaneously transmitting an optical signal and receiving an optical signal over transmit and receive fiber cables, respectively. Each of the cables has a single transmit and a single receive fiber, respectively. The ends of the transmit and receive cables have connectors on them that are adapted to plug into transmit and receive receptacles, respectively, formed in the transceiver module. These types of transceiver modules are often referred to as pluggable transceiver modules. Small form-factor pluggable (SFP) and SFP+ transceiver modules are examples of pluggable optical transceiver modules.

Typically, pluggable transceiver modules, such as the SFP and SFP+ transceiver modules, for example, are designed to be inserted into cages. The pluggable transceiver modules and the cages have locking features disposed on them that allow the transceiver modules to mate with an interlock with the cages. The external surfaces of the cages are typically designed to be inserted into openings formed in racks, with each rack typically including many such openings for receiving many such cages. The pluggable transceiver modules typically include latch lock pins that are designed to be received in latch openings formed in the cages. In order to mate the pluggable transceiver module with the cage, the module is inserted into the cage and a latching mechanism is moved to a latching position to cause the latch lock pin on the transceiver module to be extended into the latch opening formed in the cage. In order to remove the transceiver module from the cage, the latching mechanism is moved to a de-latching position to cause the latch lock pin to be retracted from the latch opening, allowing the transceiver module to be pulled out of the cage.

In most pluggable optical transceiver module designs, the area around the latch lock pin constitutes an EMI open aperture that allows EMI to escape from the transceiver module housing. The Federal Communications Commission (FCC) has set standards that limit the amount of electromagnetic radiation that may emanate from unintended sources. For this and other reasons, a variety of techniques and designs are used to shield EMI openings in transceiver module housings in order to limit the amount of EMI that passes through openings. For example, various metal shielding designs and resins that contain metallic material have been used to cover areas from which EMI may escape from the housings. So far, such techniques and designs have had only limited success, especially with respect to transceiver modules that transmit and receive data at very high data rates (e.g., 10 gigabits per second (Gbits/sec)).

EMI collars are often used with pluggable transceiver modules to provide EMI shielding. The EMI collars in use today vary in construction, but generally include a band portion that is secured about the exterior of the transceiver module housing and spring fingers having proximal ends that attach to the band portion and distal ends that extend away from the proximal ends. The spring fingers are periodically spaced about the collar. The spring fingers have folds in them near their distal ends that cause the distal ends to be directed inwards toward the transceiver module housing and to come into electrically conductive contact with the housing at periodically-spaced points on the housing. At the locations where the folds occur near the distal ends of the spring fingers, the outer surfaces of the spring fingers are in electrically conductive contact with the inner surface of the cage at periodically spaced contact points along the inner surface of the cage.

The amount of EMI that passes through an EMI shielding device is proportional to the largest dimension of an EMI open aperture in the EMI shielding device. In the known EMI collars used with optical transceiver modules, the spacing between the locations at which the distal ends of the spring fingers come into electrically conductive contact with the inner surface of the cage corresponds to the largest EMI open aperture dimension. The spacing between these contact points is generally equal to the spacing between the spring fingers. Consequently, the spacing between the spring fingers typically constitutes the largest EMI open aperture dimension on the collar. In general, the maximum EMI open aperture dimension needs to be no greater than one quarter of a wavelength of the frequency that is being attenuated. Even greater attenuation of the frequency of interest can be obtained by making the maximum EMI open aperture dimension significantly less than one quarter of a wavelength, such as, for example, one eighth or one tenth of a wavelength. However, the ability to decrease this spacing using currently available manufacturing techniques is limited. In addition, as the frequency or bit rate of the transceiver module increases, this spacing needs to be made smaller in order to effectively shield EMI. As the bit rates of these transceiver modules continue to increase, decreasing the spacing between spring fingers in order to improve EMI shielding effectiveness becomes less feasible, or impossible.

The EMI collars are typically secured to the transceiver module housings by placing the band of the collar in a recess formed in the housing. An adhesive material is contained in the recess that adheres the collar to the transceiver module housing. One of the problems associated with this method of attaching the collar is that it is susceptible to being damaged when the transceiver module housing having the collar secured thereto is inserted into a cage. During insertion of the module housing into the cage, the inner surface of the cage comes into contact with the housing and with the collar, causing forces to be exerted by the inner surface of the cage on the band and spring fingers of the collar. The exertion of such forces by the cage on the collar oftentimes deforms the collar, which can result in: (1) elimination of one or more of the electrically conductive contact points where the band of the collar and the module housing come into electrically conductive contact with each other; (2) elimination of one or more of the electrically conductive contact points where the distal ends of the spring fingers come into electrically conductive contact with electrically conductive contact points on the module housing; and (3) elimination of one or more of the electrically conductive contact points where the folds near the distal ends of the spring fingers come into electrically conductive contact with and the inner surface of the cage. The elimination of any of these electrically conductive contact points results in a reduction in EMI shielding effectiveness, which degrades performance.

Accordingly, a need exists for an EMI collar for use with a pluggable optical transceiver module that has improved EMI shielding over that provided by existing EMI collars used with pluggable optical transceiver modules.

SUMMARY OF THE INVENTION

The invention provides an EMI collar and method of using an EMI collar to shield EMI signals in an optical transceiver module. The EMI collar comprises a band having an inner surface and an outer surface, and a plurality of spring fingers. The EMI collar is configured to be secured to a housing of an optical transceiver module by securing the band to the housing such that an inner surface of the band is in contact with an outer surface of the housing. The band and the spring fingers comprise an electrically conductive material. Each of the spring fingers has a proximal end that is connected to the band and a distal end that extends away from the band. Each spring finger has at least one respective dimple formed therein between the proximal and distal ends of the respective spring finger. Each dimple is an indentation in an outer surface of the spring finger that creates at least two additional electrically conductive contact points that are located at first and second ends of the respective dimple.

These additional contact points on the spring fingers are separated from each other by a distance that is generally equal to the length, L, of the respective dimple. Under normal operating conditions and absent any damage to or abnormalities in the collar, the length L will correspond to the maximum EMI aperture dimension of the collar. Consequently, the inclusion of the dimples on the fingers results in a reduction in the size of the maximum EMI aperture dimension of the collar, which improves the EMI shielding effectiveness of the collar. In addition, the reduction in the size of the maximum EMI aperture dimension of the collar enables EMI signals of high frequencies to be more easily shielded.

The method comprises providing an EMI collar comprising a band and a plurality of spring fingers, and securing the EMI collar to the module housing by welding one or more areas on a lap joint of the band to tighten about the housing of the transceiver module such that the inner surface of the band is in contact with an outer surface of the housing.

By welding the lap joint of the band to tighten the band about the housing of the transceiver module, the band is pre-loaded to cause the inner surface of the band to be placed in substantially continuous contact with the housing. This feature of the invention eliminates or at least lessens the number of EMI apertures that exist between the inner surface of the band and the outer surface of the housing, which improves EMI shielding. In addition, the tightness with which the band is secured to the housing eliminates or at least reduces the possibility of the collar being damaged when the housing having the collar secured about it is inserted into a cage, which also serves to improve EMI shielding.

These and other features and advantages of the invention will become apparent from the following description, drawings and claims.

DETAILED DESCRIPTION OF AN ILLUSTRATIVE EMBODIMENT

In accordance with various embodiments that will be described herein, an EMI collar is provided that is configured to be secured about a housing of a pluggable optical transceiver module. The configuration of the EMI collar and the method by which the collar is attached to the housing of the transceiver module ensure that the collar will not be damaged when the transceiver module housing is inserted into a cage. Ensuring that the collar will not be damaged during insertion ensures that the electrically conductive contact points on the collar will not be eliminated. In addition, dimples, or indentations, formed on the spring fingers of the EMI collar result in a reduction in the size of the maximum EMI aperture dimension, which greatly improves the ability of the collar to attenuate EMI signals, even those having high frequencies. The improvements in EMI signal attenuation result in an overall improvement in the performance of the transceiver module and in the performance of the system in which the transceiver module is used.

Prior to describing the EMI collar of the invention in detail, a description will be provided of an example of a pluggable optical transceiver module with which the EMI collar may be used. However, the EMI collar is not limited to being used with any particular optical transceiver module or cage design. The EMI collar may be used with various other optical transceiver module designs, as will be apparent to those of ordinary skill in the art in view of the description being provided herein.

Figure 1:
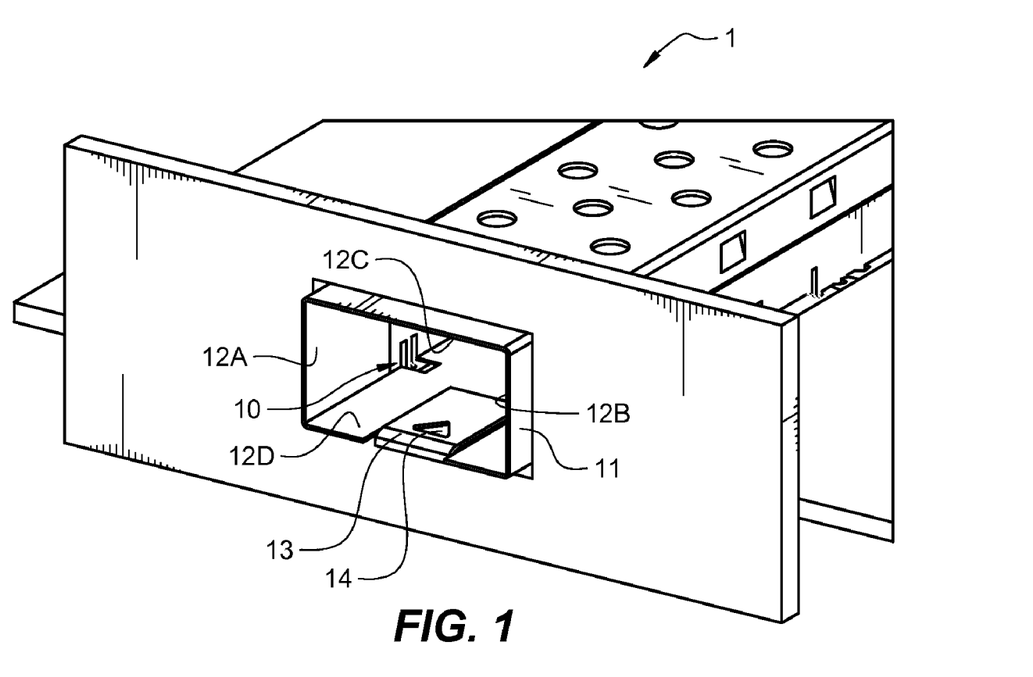
FIG. 1 illustrates a perspective view of a portion of the front side of a rack having a cage secured thereto that is suitable for receiving the transceiver module of the invention.

FIG. 1 illustrates a perspective view of a portion of the front side of a rack 1 having a known cage 10 secured thereto. The cage 10 is typically made of a flexible material, such as sheet metal for example, although other materials, such as die cast zinc may be used for the cage 10. Typically, the rack 1 will contain many such cages mounted one atop the other and side by side in close proximity to one another. The cage 10 has an interior compartment for receiving the transceiver module (not shown) through a front face 11 of the cage 10. The interior compartment of the cage 10 is defined by first and second side walls 12A and 12B, respectively, and top and bottom walls 12C and 12D, respectively. The cage 10 has a leaf spring finger 13 formed on the bottom wall 12D, which is typically made of sheet metal, and a catch 14 formed in the cage latch 13. The catch 14 is an opening shaped to receive a latch lock pin (FIG. 2B, item 40A) of the latching bail mechanism, as will be described below with reference to FIG. 2B. The catch opening 14 is one of, if not the most, important openings in the module in terms of constituting an EMI opening.

Figure 2A:
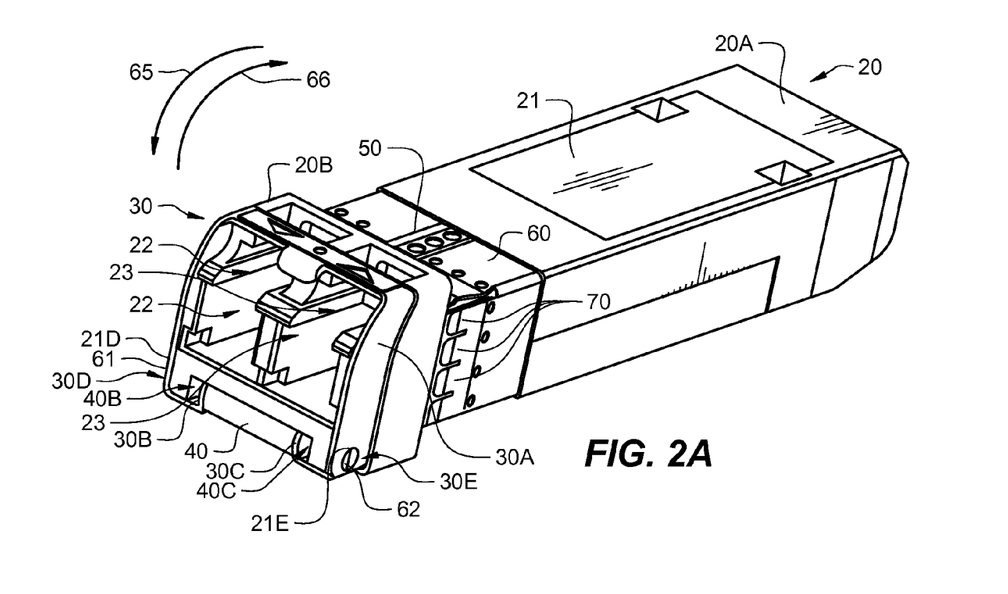
FIG. 2A illustrates a perspective top view of a portion of the transceiver module of the invention in accordance with an illustrative embodiment, which shows the latching bail mechanism of the transceiver module in the locked position.

FIG. 2A illustrates a perspective top view of a portion of the transceiver module 20 of the invention in accordance with an illustrative embodiment, which shows the latching bail mechanism 30 of the transceiver module 20 in the locked position. In the locked position, the bail 30A of the latching bail mechanism 30 is in the upright position shown. The latching bail mechanism 30 is typically made of sheet metal, although other materials, such as molded plastic, for example, may be used for this purpose. Likewise, the transceiver module housing 21 is typically made of sheet metal, although other materials, such as molded plastic, for example, may be used to make the transceiver module 20. The transceiver module 20 includes the EMI collar 50 of the invention, which is made of conductive material, such as metal, for example. The EMI collar 50 includes a band 60 that attaches about the transceiver module housing 21 and periodically spaced spring fingers 70. The spring fingers 70 have proximal ends that attach to the band 60 and distal ends that extend away from the band 60. The EMI collar 50 absorbs EMI signals emanating from within the module 20, and especially at the catch opening 14 (FIG. 1). The EMI collar 50 will be described below in detail with reference to FIGS. 5 and 6.

The transceiver module housing 21 has a proximal end portion 20A and a distal end portion 20B. When the transceiver module housing 21 is inserted into the cage 10 (FIG. 1), the proximal end portion 20A enters the cage 10 first. The transmit and receive receptacles 22 and 23, respectively, remain exposed through the front face 11 of the cage 10 to enable connectors (not shown) disposed on the ends of optical fiber cables (not shown) to be connected to the receptacles 22 and 23 of the module 20. The connectors are typically LC connectors, although other types of connectors may be used. The latching bail mechanism 30 includes a latch base 40 having male rotational coupling devices 40B and 40C that are received in and mate with female rotational coupling mechanisms 30B and 30C formed in the interior surfaces of the bail 30A. The male rotational coupling mechanism 40B and 40C formed in the latch base 40 are cylindrically shaped pins formed on proximal and distal ends of an axis about which the bail 30A rotates as it is moved from the locked position to the unlocked position, and vice versa.

The bail 30A has circular openings 30D and 30E formed in the outer surfaces thereof that receive tapered pins 21D and 21E, respectively, formed on the module housing 21. The latching bail mechanism 30 is secured to the module housing 21 by inserting the pins 21D and 21E into the circular openings 30D and 30E and then inserting the dowels 61 and 62 into the openings 30D and 30E, respectively. The bail 30A is then free to move in an arcuate manner in the downward and upward directions represented by arrows 65 and 66, respectively, through the rotational movement of the openings 30D and 30E about the pin/dowel pairs 61/21D and 62/21E, respectively.

Figure 2B:
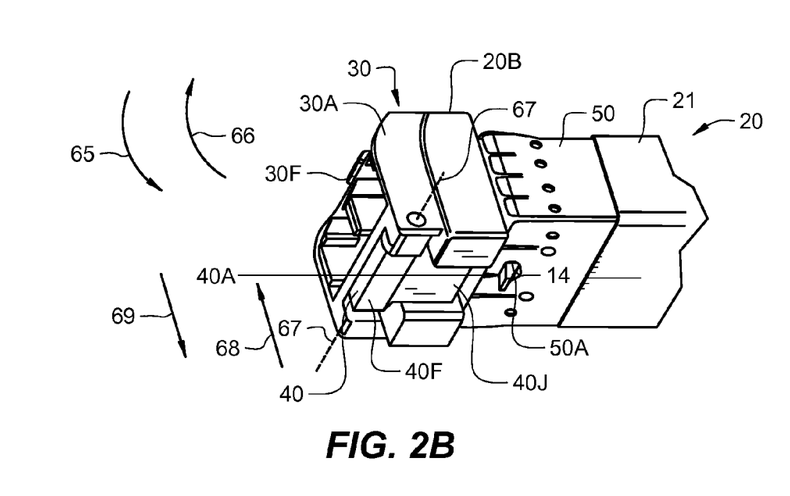
FIG. 2B illustrates a perspective bottom view of a portion of the transceiver module shown in FIG. 2A, which shows the latching bail mechanism in the locked position depicted in FIG. 2A.

FIG. 2B illustrates a perspective bottom view of a portion of the transceiver module 20 shown in FIG. 2A, which shows the latching bail mechanism 30 in the locked position depicted in FIG. 2A. In the locked position, the latch lock pin 40A is fully extended down through the opening forming the catch 14 in the cage 10 (FIG. 1) and through an opening 50A formed in the EMI collar 50. When the bail 30A is moved toward the locked position shown in FIGS. 2A and 2B, the female rotational coupling mechanisms 30B and 30C move along an axis that is eccentric relative to an imaginary axis 67 that passes through the centers of the circular openings 30D and 30E formed in the outer surfaces of the bail 30A. The movement is in the direction indicated by arrow 66 and the eccentric access is parallel to axis 67. This eccentric movement of the female rotational coupling mechanisms 30B and 30C causes the pins 40B and 40C that are disposed on the latch base 40 and coupled with the female rotational coupling mechanisms 30B and 30C, respectively, to also move eccentrically relative to the imaginary axis 67 in the direction of arrow 66. This, in turn, causes the proximal end 40F of the latch base 40 to be moved in the upward direction represented by arrow 68.

When the proximal end 40F of the latch base 40 is moved in the upward direction indicated by arrow 68, this movement causes the latch lock pin 40A disposed on the distal end 40J of the latch base 40 to be forced down through the openings 14 and 50A. Thus, when the proximal end 40F of the latch base 40 cannot be moved any farther in the direction indicated by arrow 68, the latch lock pin 40A is in its fully extended position. In this position, any forces exerted on the module housing 21 that are transferred to the latch lock pin 40A are then transferred to the housing 21, where they are absorbed.

When the bail 30A is moved to the unlocked position by moving the bail 30A in the downward direction represented by arrow 65, the female rotational coupling mechanisms 30B and 30C move along an axis that is eccentric relative to the imaginary axis 67 that passes through the centers of the circular openings 30D and 30E formed in the exterior surfaces of the bail 30A. This eccentric movement of the female rotational coupling mechanisms 30B and 30C is in the direction indicated by arrow 65. This eccentric movement causes the pins 40B and 40C that are disposed on the latch base 40 and coupled with the female rotational coupling mechanisms 30B and 30C, respectively, to also move along the axis that is eccentric relative to the imaginary axis 67 in the direction of arrow 65. This, in turn, causes the proximal end 40F of the latch base 40 to be moved in the downward direction represented by arrow 69.

When the proximal end 40F of the latch base 40 is moved in the downward direction indicated by arrow 69, this movement causes the latch lock pin 40A disposed on the distal end 40J of the latch base 40 to retract through the openings 14 and 50A. Movement of the proximal end 40F of the latch base 40 in one direction produces movement of the distal end 40J of the latch base 40 in the opposite direction. Thus, the distal end 40J of the latch base 40 cannot be moved any farther due to abutment with the lower surface of the housing 21, the latch lock pin 40A is in its fully retracted position.

Figure 3:
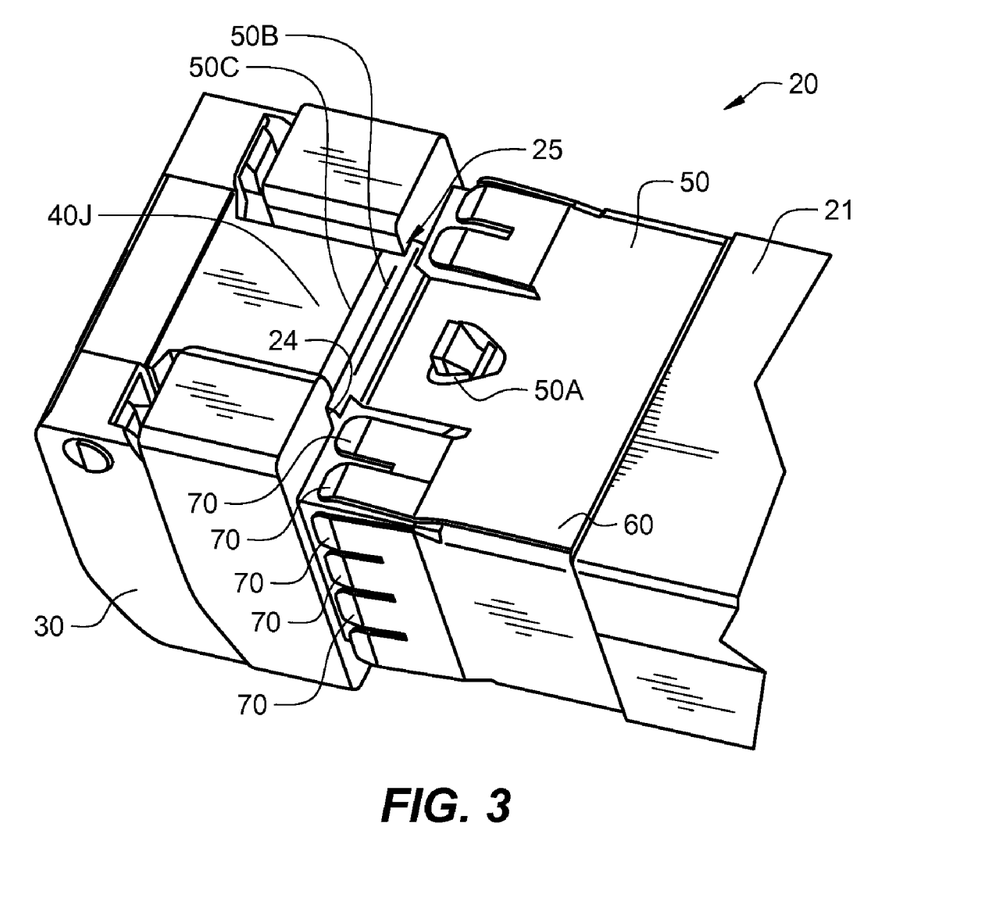
FIG. 3 illustrates a bottom perspective view of a portion of the transceiver module that more clearly shows the features of the EMI collar shown in FIGS. 2A and 2B and the locations at which the EMI collar is in contact with the housing and the latching mechanism.

FIG. 3 illustrates a bottom perspective view of a portion of the transceiver module 20 shown in FIG. 2B that more clearly shows the features of the EMI collar 50 and the locations where the EMI collar 50 and the module housing 21 are in contact with each other. The EMI collar 50 includes a bent portion 50B having a ridge shape. When the collar 50 is secured to the housing 21, the bottom portion of the distal end 40J of the latch base 40 is adjacent the bent portion 50B of the collar 50. The end 50C of the bent portion 50B of the collar 50 is locked within channels 24 and 25 formed in opposite sides of the housing 21 when the collar 50 is secured to the housing 21.

The latching mechanism 30 is installed in the module housing 21 by dropping the latch base 40 into the housing vertically from the bottom of the housing 21 and then securing the collar 50 to the housing 21. The end 50C of the bent portion 50B is inserted into the channels 24 and 25 formed in the housing 21. As will be described below in detail with reference to FIG. 6, the band 60 of the EMI collar 50 preferably is secured to the transceiver module housing 21 by welding a lap joint (FIGS. 5 and 6) formed in the band 60. Typically, a laser welding procedure or a spot welding procedure will be used for this purpose. As the weld zone on the lap joint cools, the band 60 tightens around the housing 21, which results in a pre-loading of the band 60. This pre-loading of the band 60 results in the inner surface of the band 60 being in substantially continuous contact with the housing 21, which significantly improves EMI shielding by eliminating EMI apertures between the housing 21 and the inner surface of the band 60. In addition, the pre-loading of the band 60 ensures that the EMI collar 50 will not be deformed when the transceiver module 20 having the collar 50 secured thereto is inserted into the cage 1 (FIG. 1).

Figure 4:
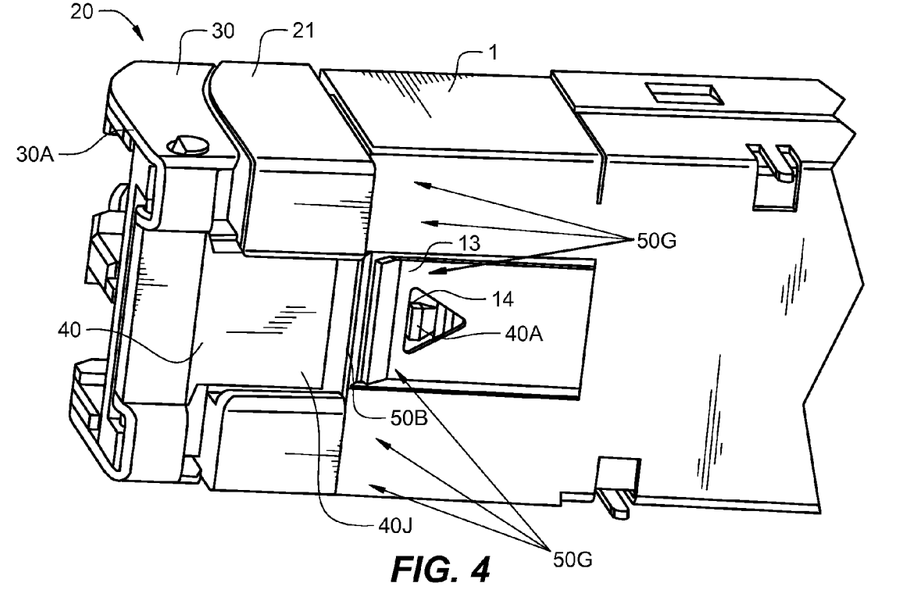
FIG. 4 illustrates a bottom perspective view of a portion of the transceiver module shown in FIG. 3 with the transceiver module secured to the cage shown in FIG. 1.

FIG. 4 illustrates a bottom perspective view of a portion of the transceiver module 20 shown in FIG. 3, which illustrates the transceiver module 20 secured within the cage 1 shown in FIG. 1. The bail 30A of the latching bail mechanism 30 is shown in the locked position, and so the latch lock pin 40A is shown in its fully extended position. The only portion of the EMI collar 50 that is visible in FIG. 4 is the bent portion 50B of the collar 50, which is locked within the channels 24 and 25 (FIG. 3) formed in the housing 21 and which is in abutment with the bottom portion of the distal end 40J of the latch base 40. The latch 13 of the cage 1 is in contact with the collar 50 at least at locations 50G on the collar 50, which correspond to the locations of the folds formed in the spring fingers 70 (FIG. 2A) of the collar 50. This contact between the latch 13 of the cage 1 and the spring fingers 70 of the EMI collar 50 also serves to eliminate EMI apertures around the latch lock pin 40A, thereby improving EMI shielding in this area.

Figure 5:
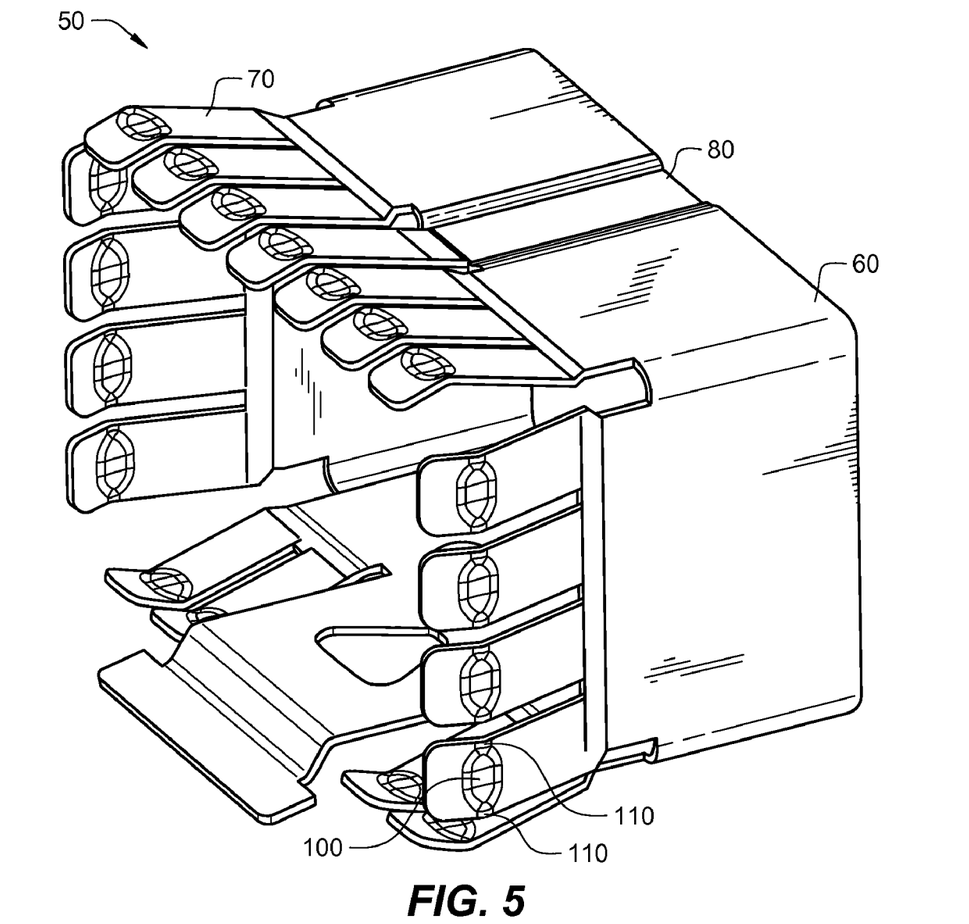
FIG. 5 illustrates a front perspective view of the EMI collar shown in FIGS. 2A-4 in accordance with an embodiment.
Figure 6:
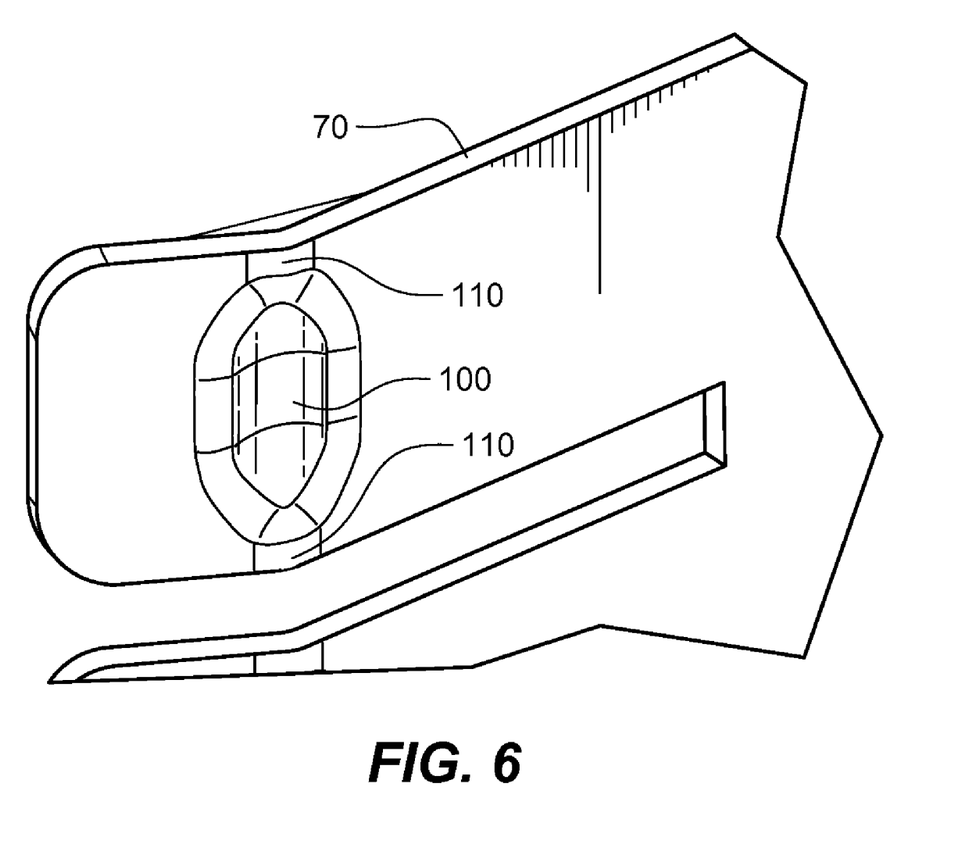
FIG. 6 illustrates a magnified perspective view of one of the spring fingers of the EMI collar shown in FIG. 5, which illustrates the dimples formed in the spring fingers for reducing the EMI open aperture provided by the spring fingers.

FIG. 5 illustrates a front perspective view of the EMI collar 50 shown in FIGS. 2A-4 in accordance with an embodiment. FIG. 6 illustrates an expanded perspective view of one of the spring fingers 70 of the EMI collar shown in FIG. 5. As described above, the EMI collar 50 is made of a flexible, electrically conductive material, such as sheet metal, for example, and includes a band 60 and a plurality of spring fingers 70. In accordance with this embodiment, each spring finger 70 has a dimple, or indentation, 100 formed in it at the location where the finger 70 is bent inward. As indicated above, in the aforementioned known EMI collar, the location where the spring finger is bent inward is an electrically conductive contact point that is in contact with the cage when the transceiver module is contained in the cage. Therefore, in the aforementioned known EMI collar, the spacing between these electrically conductive contact points is generally equal to the spacing between the spring fingers.

In contrast, in accordance with the invention, the existence of the dimples 100 in the spring fingers 70 creates two electrically conductive contact points 110 on either side of the respective dimples 100. The spacing between the contact points 110 is equal to the length L of the dimple 100. The length L of the dimple 100 is the maximum EMI aperture dimension of the collar 50. Therefore, the EMI that passes through the collar 50 will be proportional to the length L. Consequently, the length L should be less than or equal to one quarter wavelength of the EMI signal intended to be attenuated by the collar 50. Because the EMI collar 50 will typically be designed to attenuate a range of frequencies rather than a single frequency, the length L should be less than or equal to one quarter wavelength of the EMI signal having the highest frequency in a range of frequencies intended to be attenuated by the EMI collar.

With current manufacturing techniques used to make EMI collars, it would be difficult to reduce the spacing between the spring fingers enough to attenuate high frequencies (e.g., 10 Gb/s). By indenting the spring fingers 70 to form the dimples 100, each spring finger 70 is provided with two contact points 110, which essentially halves the maximum EMI aperture dimension compared to that provided by the aforementioned known EMI collar. As a result, the EMI collar 50 is capable of more effectively attenuating frequencies. For example, for lower frequencies, the dimpled spring finger configuration of the invention enables a maximum EMI aperture dimension of one eighth or one tenth of a wavelength to be easily achieved using current manufacturing techniques, which results in better EMI signal attenuation than if a maximum EMI aperture dimension of one quarter of a wavelength is used. On the other hand, for higher frequencies, the dimpled spring finger configuration of the invention enables a maximum EMI aperture dimension of one quarter of a wavelength or less to be easily achieved with current manufacturing techniques, which may not be achievable at all with the aforementioned known EMI collar due to the difficulties associated with creating an extremely small spacing between spring fingers with current manufacturing techniques. With the dimpled spring finger configuration of the invention, the maximum EMI aperture dimension is essentially halved compared to that of the aforementioned known EMI collar even if the spacing between the spring fingers 70 is the same as the spacing between the spring fingers of the known EMI collar.

It should be noted that although FIG. 6 illustrates each spring finger 70 having a single dimple 100 formed thereon, resulting in the two contact points 110 on either side of the dimple 100, each spring finger 70 could have two or more dimples formed thereon and arranged side by side to further reduce the maximum EMI aperture dimension. For example, assuming that the size and spacing of the spring fingers does not change, if two identical dimples were formed on each of the spring fingers and arranged side by side, the dimples would provide at least three contact points instead of two. This additional contact point would further reduce the maximum EMI aperture dimension of the collar, which would further improve EMI shielding effectiveness.

As indicated above with reference to FIG. 3, the band 60 of the EMI collar 50 preferably is secured to the transceiver module housing 21 by welding a lap joint formed in the band 60. With reference again to FIG. 5, the lap joint is represented by numeral 80. The lap joint 80 comprises overlapping ends of the band 60. By using a laser welding procedure or a spot welding procedure, the one or more areas on the lap joint 80 can be welded to cause the overlapping ends of the band 60 that form the lap joint 80 to become fused together. As the weld zone cools, the band 60 tightens around the transceiver module housing 21 (FIG. 3), which results in a pre-loading of the band 60. This pre-loading of the band 60 results in the inner surface of the band 60 being in substantially continuous contact with the housing 21, which significantly improves EMI shielding by eliminating EMI apertures between the housing 21 and the inner surface of the band 60. In addition, the pre-loading of the band 60 ensures that the EMI collar 50 will not be deformed when the transceiver module 20 having the collar 50 secured thereto is inserted into the cage 1 (FIG. 1). It should be noted, however, that the lapping joint 80 is not required and that a variety of other mechanisms and techniques (e.g., adhesives) may be used to secure the collar 50 to the housing 21.

It can be seen from the description of the EMI collar 50 provided above that the EMI collar 50 has several advantages over the aforementioned known EMI collar. The dimpled spring finger configuration of the EMI collar 50 enables the maximum EMI aperture dimension of the collar 50 to be significantly reduced below that which is capable of being achieved by the known EMI collar spring finger configuration. This reduction in the maximum EMI aperture dimension results in a significant overall improvement in EMI shielding at all frequencies, but also at higher frequencies that cannot be shielded using the known EMI collar configuration. In addition, the welding of the lap joint 80 results in a tightening (i.e., pre-loading) of the band 60 around the transceiver module housing 21 (FIG. 3) that ensures that the inner surface of the band 60 is in substantially continuous contact with the housing 21. This substantially continuous contact between the inner surface of the band 60 and the housing 21 eliminates EMI apertures between the inner surface of the band 60 and the housing 21, thereby further improving EMI shielding. Furthermore, the pre-loading of the band 60 ensures that the integrity of the contact points is maintained by eliminating or at least lessening the possibility that insertion of the housing 21 into the cage 1 (FIG. 1) will result in the collar 50 moving and/or being deformed in a way that eliminates contact points. Ensuring that the integrity of the contact points is maintained helps to increase EMI shielding effectiveness.

It should be noted that the invention has been described with reference to a few illustrative embodiments for the purposes of demonstrating the principles and concepts of the invention and the manner in which they may be implemented. The invention is not limited to these embodiments, but rather, a variety of modifications may be made to these embodiments without deviating from the scope of the invention. For example, although the entire EMI collar 50 has been described above as having a particular configuration, the configuration of the collar 50 may be altered in many ways without comprising the EMI shielding effectiveness of the collar 50. Those skilled in the art will understand the manner in which modifications may be made to the embodiments described herein and that all such modifications are within the scope of the invention.

What is claimed is:

1. An electromagnetic interference (EMI) collar for use with an optical transceiver module, the EMI collar comprising:

a band having an inner surface and an outer surface, wherein the EMI collar is configured to be secured to a housing of the optical transceiver module by securing the band to the housing such that the inner surface of the band is in contact with an outer surface of the housing, the band comprising an electrically conductive material; and a plurality of spring fingers, the spring fingers comprising an electrically conductive material, each spring finger having a proximal end that is connected to the band and a distal end that extends away from the band, each spring finger having at least one respective dimple formed therein between the proximal and distal ends of the respective spring finger, wherein each dimple is an indentation in an outer surface of the spring finger that creates at least two additional electrically conductive contact points, said at least two additional electrically conductive contact points being located at first and second ends of the respective dimple formed on the respective spring finger.

2. The EMI collar of claim 1, wherein each spring finger has a bend formed therein between the proximal and distal ends of the spring finger, and wherein the respective dimples are formed at the respective bends in the respective spring fingers.

3. The EMI collar of claim 2, wherein each respective dimple has a length, L, corresponding to a distance between the first and second ends of each respective dimple, and wherein L is less than or equal to one quarter of a wavelength of an EMI signal intended to be attenuated by the EMI collar.

4. The EMI collar of claim 2, wherein each respective dimple has a length, L, corresponding to a distance between the first and second ends of the respective dimple, and wherein L is less than or equal to one eighth of a wavelength of an EMI signal intended to be attenuated by the EMI collar.

5. The EMI collar of claim 2, wherein each respective dimple has a length, L, corresponding to a distance between the first and second ends of each respective dimple, and wherein L is less than or equal to one tenth of a wavelength of an EMI signal intended to be attenuated by the EMI collar.

6. The EMI collar of claim 2, wherein the band has first and second ends that overlap to form a lap joint, and wherein the band is secured to the transceiver module housing by welding one or more areas on the lap joint to cause the band to tighten about the housing of the transceiver module.

7. The EMI collar of claim 6, wherein the tightening of the band corresponds to a pre-loading of the band that places the inner surface of the band in substantially continuous contact with the housing.

8. The EMI collar of claim 1, wherein the band has an opening formed therein that is configured to allow a latch lock pin of a latching mechanism of the transceiver module to be inserted into and retracted through the opening.

9. A method for providing EMI shielding in an optical transceiver module comprising:

providing an EMI collar comprising a band and a plurality of spring fingers, the band having an inner surface and an outer surface, wherein the EMI collar is configured to be secured to a housing of an optical transceiver module by securing the band to the housing such that the inner surface of the band is in contact with an outer surface of the housing, each of the spring fingers having a proximal end that is connected to the band and a distal end that extends away from the band, and wherein the band has first and second ends that overlap to form a lap joint; and securing the EMI collar to the module housing by welding one or more areas on the lap joint to cause the band to tighten about the housing of the transceiver module.

10. The method of claim 9, wherein said one or more areas on the lap joint are welded using a spot welding procedure.

11. The method of claim 9, wherein said one or more areas on the lap joint are welded using a laser welding procedure.

12. The method of claim 9, wherein the tightening of the band corresponds to a pre-loading of the band that places the inner surface of the band in substantially continuous contact with the housing.

13. The method of claim 9, wherein each spring finger has at least one respective dimple formed therein between the proximal and distal ends of the respective spring finger, wherein each dimple is an indentation in an outer surface of the spring finger that creates at least two additional electrically conductive contact points on the spring finger, said at least two additional electrically conductive contact points being located at first and second ends of the respective dimple formed on the respective spring finger.

14. The method of claim 13, wherein each spring finger has a bend formed therein between the proximal and distal ends of the spring finger, and wherein the respective dimples are formed at the respective bends in the respective spring fingers.

15. The method of claim 14, wherein each respective dimple has a length, L, corresponding to a distance between the first and second ends of the respective dimple, and wherein L is less than or equal to one quarter of a wavelength of an EMI signal intended to be attenuated by the EMI collar.

16. The method of claim 14, wherein each respective dimple has a length, L, corresponding to a distance between the first and second ends of the respective dimple, and wherein L is less than or equal to one eighth of a wavelength of an EMI signal intended to be attenuated by the EMI collar.

17. The method of claim 14, wherein each respective dimple has a length, L, corresponding to a distance between the first and second ends of the respective dimple, and wherein L is less than or equal to one tenth of a wavelength of an EMI signal intended to be attenuated by the EMI collar.

18. The method of claim 9, wherein the band has an opening formed therein that is configured to allow a latch lock pin of a latching mechanism of the transceiver module to be inserted into and retracted through the opening.

* * * * *